United States Patent
Chang et al.

(10) Patent No.: US 9,541,234 B2
(45) Date of Patent: Jan. 10, 2017

(54) MEASURING MACHINE HAVING A PROTECTIVE COVER

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Chih-Kuang Chang, New Taipei (TW); Zhong-Kui Yuan, Shenzhen (CN); Jun-Hua Li, Shenzhen (CN); Yu Jin, Shenzhen (CN); Hui Zhang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 325 days.

(21) Appl. No.: 14/192,885

(22) Filed: Feb. 28, 2014

(65) Prior Publication Data
US 2015/0022954 A1    Jan. 22, 2015

(30) Foreign Application Priority Data

Jul. 19, 2013   (CN) .................. 2013 2 04298025 U

(51) Int. Cl.
| | |
|---|---|
| *F16P 1/00* | (2006.01) |
| *H05K 5/02* | (2006.01) |
| *H05K 5/03* | (2006.01) |
| *G01D 11/24* | (2006.01) |
| *G01B 11/02* | (2006.01) |

(52) U.S. Cl.
CPC ................ *F16P 1/00* (2013.01); *G01D 11/24* (2013.01); *H05K 5/02* (2013.01); *H05K 5/03* (2013.01); *G01B 11/02* (2013.01)

(58) Field of Classification Search
CPC ................ H05K 5/02; H05K 5/03; F16P 1/00
See application file for complete search history.

(56) References Cited

U.S. PATENT DOCUMENTS

| | | | | |
|---|---|---|---|---|
| 4,385,539 A | * | 5/1983 | Meyerhoefer | ......... B23Q 11/08 83/473 |
| 6,118,540 A | * | 9/2000 | Roy | ....................... G01N 21/88 29/759 |
| 7,952,870 B1 | * | 5/2011 | Zhou | ................... F04D 25/0613 165/122 |

(Continued)

*Primary Examiner* — Hezron E Williams
*Assistant Examiner* — David Z Huang
(74) *Attorney, Agent, or Firm* — Zhigang Ma

(57) ABSTRACT

A measuring machine includes a measuring device and a protective cover covering the measuring device. The measuring device is configured to measure parameters of a work piece. The measuring device includes a control box, a supporting board, a light ring configured to illuminate the work piece, and a camera module configured to obtain images of the work piece. The cover is made of non-transparent material. A first side of the cover defines a cut-out and a first slot. A second side of the cover opposite to the first side defines a second slot corresponding in size and alignment with the first slot. One side of the control box is exposed from the cut. Two ends of the supporting board are positioned on the first and second slots and exposed from the first and second slots.

15 Claims, 3 Drawing Sheets

(56) References Cited

U.S. PATENT DOCUMENTS

| | | | |
|---|---|---|---|
| 8,581,457 B2 * | 11/2013 | Takahashi | B60K 7/0007 180/65.51 |
| 2003/0213801 A1 * | 11/2003 | Bradley | H02G 3/14 220/3.8 |
| 2006/0024040 A1 * | 2/2006 | Gladnick | G01N 21/8806 396/182 |
| 2006/0038985 A1 * | 2/2006 | Blanc | G01B 11/00 356/237.1 |
| 2008/0170239 A1 * | 7/2008 | Uemura | G03F 7/70791 356/620 |
| 2011/0259315 A1 * | 10/2011 | Brown | B23D 45/06 125/9 |

* cited by examiner

MEASURING MACHINE HAVING A PROTECTIVE COVER

CROSS-REFERENCE TO RELATED APPLICATION

This application is related to co-pending U.S. patent application Ser. No. 29/462,378, entitled "HOUSING FOR MEASURING MACHINE", by Chang et al., which has the same assignee as the present application. The above-identified application is incorporated herein by reference.

BACKGROUND

1. Technical Field

The disclosure generally relates to measuring machines, and particularly to a measuring machine using imaging technology and having a protective cover.

2. Description of Related Art

Measuring machines are widely used in precision measurement field to measure parameters such as dimensions, assembly positions, and forms (i.e. contour or shape) of workpieces. The measuring machines play an important role in ensuring quality of the work pieces. Such measuring machines often use imaging technology to determine the various measured parameters.

In use, the measuring machine is commonly in an uncovered state. Components, such as a camera module are exposed to the nearby environment and therefore, for example, can be polluted by dust, which may negatively influence a measured result. Furthermore, the measuring machine usually has a plurality of light sources (i.e. LED lights) which emit strong light to illuminate the workpieces. The strong light may hurt eyes of an operator if the operator operates the measuring machine for a long time and without adequate eye protection.

Therefore, there is room for improvement within the art.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the disclosure.

DETAILED DESCRIPTION

Figure 1:
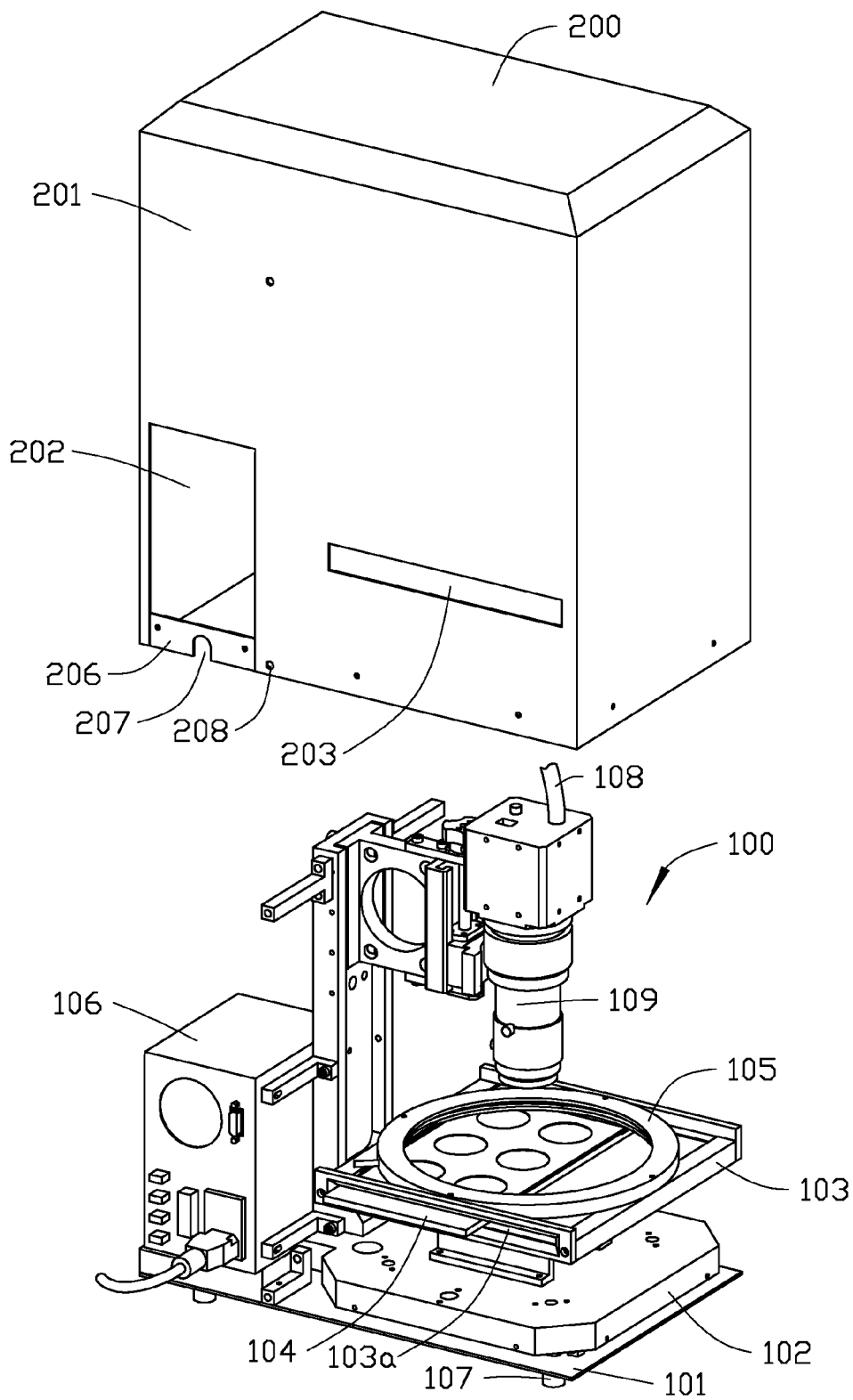
FIG. 1 is a schematic view of a measuring machine in an uncovered state, according to an exemplary embodiment of the disclosure.

FIG. 1 is a disassembled view of a measuring machine in an uncovered state, according to an exemplary embodiment of the disclosure. The measuring machine includes a measuring device 100 and a protective cover 200. Various parameters are preset (as stored in the processor of the measuring device 100) in the measuring device 100 and the measuring device 100 is operated in covered environment. The measuring device 100 is covered by the protective cover 200 for protection and to prevent the light emitted from a light source of the measuring device 100 from hurting the eyes of an operator.

The measuring device 100 is configured to measure parameters such as dimensions, assembly positions, and forms (i.e. contour or shape) of a work piece to ensure quality of the workpiece. In this exemplary embodiment, the measuring device 100 is configured to measure forms (i.e. contour or shape) of a logo of an electronic device.

The measuring device 100 includes a base board 101, a fixed board 102 positioned on one end of the base board 101, a platform 103 positioned above and parallel to the fixed board 102, a supporting board 104, a light ring 105 fixed to the supporting board 104, and a control box 106 fixed on another side of the base board 101, opposite to the fixing board 102 and a camera module 109. The platform 103 includes two frames (not labeled) respectively positioned at two opposite sides of the platform 103. The supporting board 104 is positioned on and movable relative to the platform 103 for positioning the work piece relative to the camera module 109. Two opposite ends of the supporting board 104 extend through slots 103a in the frames of the platform 103. Furthermore, the supporting board 104 is spaced from the light ring 105 to allow a clearance between the supporting board 104/work piece combination, so as to not impact with the light ring 105 when the supporting board 104/work piece combination are inserted or removed from the measuring machine. Supporting posts 107 protrude from the base board 101. For example, a supporting post 107 can protrude from each corner of the base board 101 A plurality of light sources (not individually shown) is positioned inside the light ring 105 to illuminate the work piece. The control box 106 contains one or more controllers for turning the light sources on/off. One side of the control box 106 defines a plurality of serial ports (not labeled) and a power interface (not labeled). The camera module 109 is configured to obtain images of the work piece so that the measuring device 100 can measure the above-mentioned parameters of the work piece according to the images.

The protective cover 200 is substantially cubic and formed by four perpendicularly connected side walls. The cover 200 is made of non-transparent material. In the exemplary embodiment, the cover is made of a paint coated iron sheet. In this exemplary embodiment, a first side wall 201 of the cover 200 defines a substantial rectangular cut-out 202 and a first through slot 203. The slots 103a and the first slot 203 are taller than the height of the supporting board/work piece combination so that the supporting board 104/work piece combination can be slid into and out of the measuring device 100. The cut-out 202 is longitudinally defined in the side wall 201 adjacent to a corner of the side wall 201. The first slot 203 extends along an axis perpendicular to the cut-out 202. A second side wall 204 of the cover 200 opposite to the first side wall 201 defines a second through slot 205 (see FIG. 3) corresponding in size and alignment with the first slot 203. The cover 200 further includes a blocking plate 206 positioned at a bottom portion of the cut-out 202. A window 207 is defined near or at a middle portion of the blocking plate 206. A bottom of the cover 200 is uncovered so that the cover 200 can be positioned over the measuring device 100 to cover the measuring device 100. A plurality of fixing holes 208 are defined in the side walls of the cover 200 for fixing the cover 200 to the measuring device 100 (such as by screws).

In assembly, the cover 200 covers the measuring device 100 from the bottom and latches to the fixed board 102 via the fixing holes 208.

Figure 2:
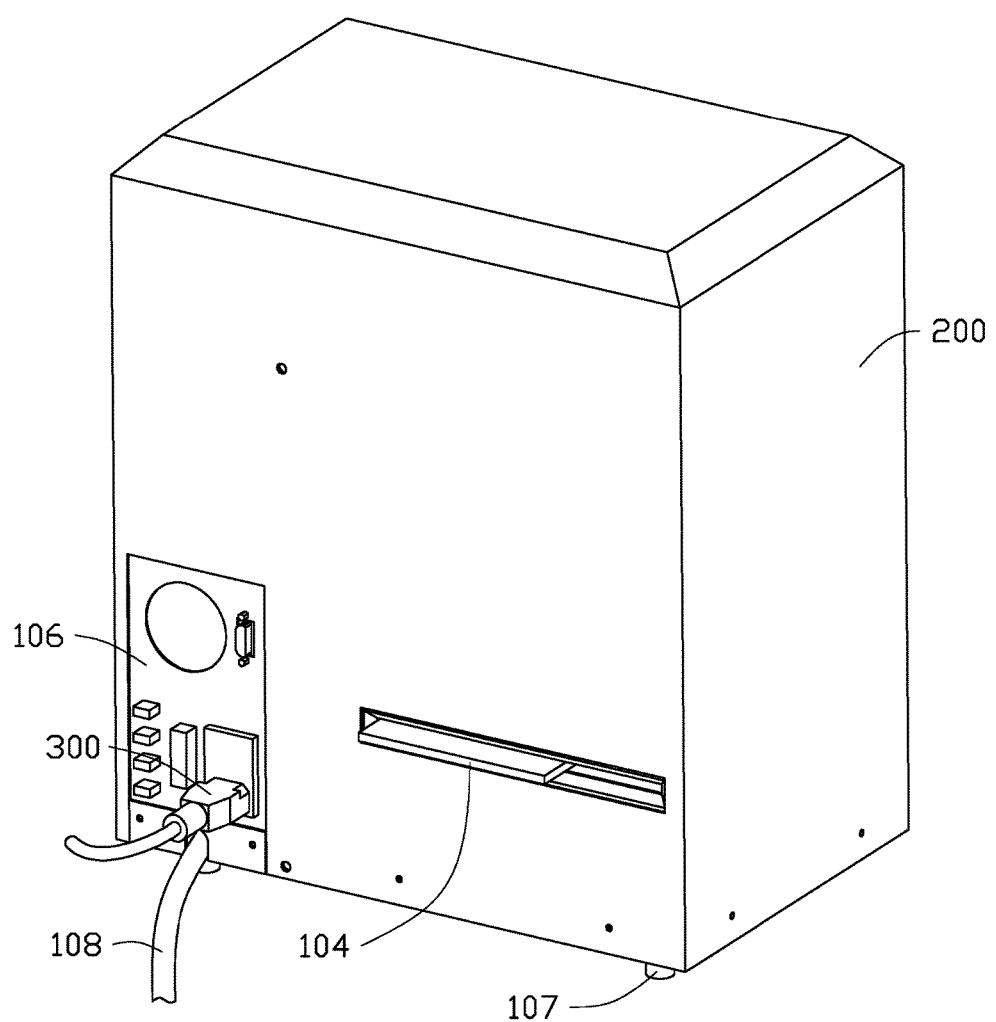
FIG. 2 is a schematic view of the measuring machine of FIG. 1 in a covered state.
Figure 3:
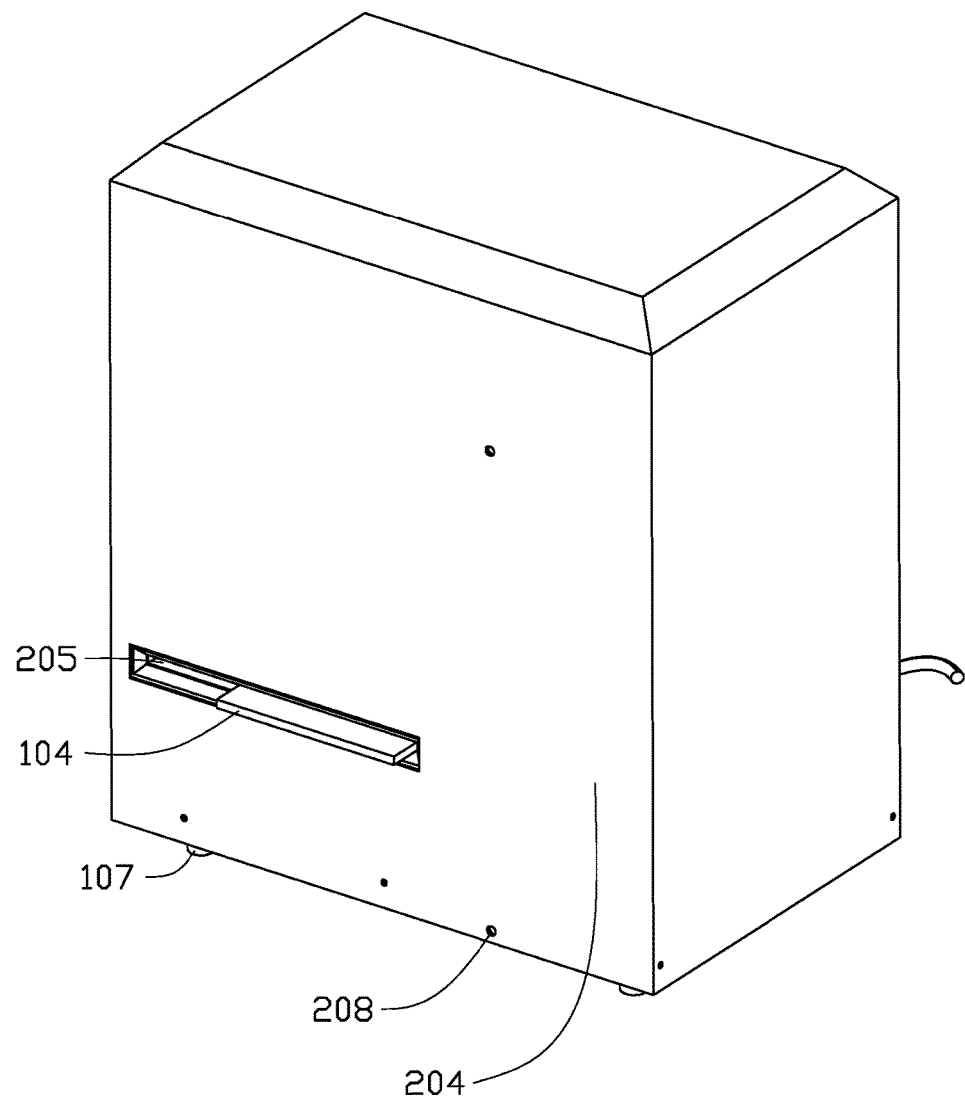
FIG. 3 is similar to FIG. 2, but shown from another aspect.

FIGS. 2 and 3 show that, when the cover 200 is covering the measuring device 100, the serial ports and the power interface of the control box 106 are exposed from the cut-out 202 and two opposite ends of the supporting board 104 are exposed from the first slot 203 and the second slot 205, respectively. Therefore, the operator can conveniently extract and exchange the supporting board 104 outside the cover 200 to remove the workpiece.

In use, a plug 300 of a power source is inserted into the power interface of the control box 106 to provide electric power to the measuring device 100. In addition, the data cable 108 protrudes from the window 207 to connect to a computer so that measuring information such as measuring images can be transmitted to a computer to be analyzed via the data cable 108.

In other exemplary embodiments, the shape of the cover 200 is not limited to the cubic shape and can be other shapes corresponding to the measuring device 10.

Furthermore, a shape and dimensions of the cut-out 202 are corresponding to those of the control box 106 so that the shape and the dimensions of the cut-out 202 can be adjusted according to the shape and dimensions of the control box 106.

In addition, dimensions of the base board 101 can be larger than those of the bottom of the cover 200 so that the cover 200 can be supported by the base board 100.

The protective cover 200 covers the measuring device 100 to protect the measuring device 100 from environmental contaminants and prevents the strong light emitting from light source of the measuring device 100 from damaging the eyes of the operator.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A measuring machine comprising:
a measuring device configured to measure parameters of a work piece, the measuring device comprising a controlling box, a supporting board, a light ring configured to illuminate the work piece, a camera module configured to obtain images of the work piece, a fixed board and a platform positioned on the fixed board, wherein the supporting board is positioned on the platform and movable relative to the platform; and
a protective cover covering the measuring device, the cover made of non-transparent material, a first side of the cover defining a cut-out and a first slot, a second side of the cover opposite to the first side defining a second slot corresponding in size and alignment with the first slot; wherein one side of the controlling box is exposed from the cut-out, two ends of the supporting board are positioned on the first and second slots and exposed from the first and second slots.

2. The measuring machine of claim 1, wherein the cover further comprises a blocking plate positioned at a bottom portion of the cut-out, the blocking plate defining a window configured to extend through a data cable.

3. The measuring machine of claim 1, wherein the controlling box comprises a power interface exposed from the cut-out and configured to connect to a power supply.

4. The measuring machine of claim 1, wherein a bottom of the cover is uncovered, the measuring device further comprises a base board, the controlling box and the supporting board are positioned on the base board, and the bottom of the cover is positioned on the base board and supported by the base board.

5. The measuring machine of claim 1, wherein a shape and dimensions of the cut-out are corresponding to those of the controlling box and dimensions of the first and second slots are corresponding to those of the supporting board.

6. The measuring machine of claim 1, wherein the platform further comprises two frames respectively positioned at two opposite sides of the platform, two ends of the supporting board extended through the frames and exposed from the first and second slots.

7. The measuring machine of claim 1, wherein the measuring device further comprises a light ring positioned above the supporting board and spaced from the supporting board.

8. The measuring machine of claim 1, wherein the cover is formed by four perpendicularly connected side walls, the side walls defines a plurality of fixing holes adjacent to a bottom of the cover; the cover is fixed to the fixed board by the fixing holes.

9. A measuring machine comprising:
a measuring device configured to measure parameters of a work piece, the measuring device comprising a base board, a controlling box, a supporting board, a light ring configured to illuminate the work piece, a camera module configured to obtain images of the work piece, a fixed board and a platform positioned on the fixed board; wherein the controlling box and the supporting board are positioned on the base board, the supporting board is positioned on the platform and movable relative to the platform; and
a protective cover made of non-transparent material, the protective cover having an uncovered bottom, the bottom positioned on the base board and supported by the base board to cover the measuring device, a first side of the cover defining a cut-out and a first slot, a second side of the cover opposite to the first side defining a second slot corresponding in size and alignment with the first slot; wherein one side of the controlling box is exposed from the cut-out, two ends of the supporting board are positioned on the first and second slots and exposed from the first and second slots.

10. The measuring machine of claim 9, wherein the cover further comprises a blocking plate positioned at a bottom portion of the cut-out, the blocking plate defining a window configured to extend through a data cable.

11. The measuring machine of claim 9, wherein the controlling box comprises a power interface exposed from the cut-out and configured to connect to a power supply.

12. The measuring machine of claim 9, wherein a shape and dimensions of the cut-out are corresponding to those of the controlling box and dimensions of the first and second slots are corresponding to those of the supporting board.

13. The measuring machine of claim 9, wherein the platform further comprises two frames respectively positioned at two opposite sides of the platform, two ends of the supporting board are extended through the frames and exposed from the first and second slots.

14. The measuring machine of claim 9, wherein the measuring device further comprises a light ring positioned above the supporting board, and spaced from the supporting board.

15. The measuring machine of claim 9, wherein the cover is formed by four perpendicularly connected side walls, the side walls defines a plurality of fixing holes adjacent to a bottom of the cover; the cover is fixed to the fixed board by the fixing holes.

* * * * *